United States Patent
Bahl et al.

(10) Patent No.: US 6,543,885 B2
(45) Date of Patent: Apr. 8, 2003

(54) INK JET CHARGE PLATE WITH INTEGRATED FLEXIBLE LEAD CONNECTOR STRUCTURE

(75) Inventors: Surinder K. Bahl, Beavercreek, OH (US); James E. Harrison, Jr., Dayton, OH (US); Richard W. Sexton, Huber Heights, OH (US)

(73) Assignee: Scitex Digital Printing, Inc., Dayton, OH (US)

( * ) Notice: Subject to any disclaimer, the term of this patent is extended or adjusted under 35 U.S.C. 154(b) by 0 days.

(21) Appl. No.: 09/894,374

(22) Filed: Jun. 27, 2001

(65) Prior Publication Data

US 2003/0001932 A1 Jan. 2, 2003

(51) Int. Cl.[7] .............................................. B41J 2/085
(52) U.S. Cl. .......................................................... 347/76
(58) Field of Search ........................... 347/50, 74, 76; 29/890.1; 216/27; 439/67

(56) References Cited

U.S. PATENT DOCUMENTS 5,632,627 A * 5/1997 Aoki ........................... 439/67
6,274,057 B1 * 8/2001 Sexton et al. ................. 216/27

* cited by examiner

Primary Examiner—Anh T. N. Vo
(74) Attorney, Agent, or Firm—Barbara Joan Haushalter

(57) ABSTRACT

Metallic bumps are formed for electrical interconnection between the charge plate and the charge drive electronics. This is achieved by having improved electrical connection between an ink jet charge plate and associated charge leads is promoted. This is achieved by integrating the termination pads, electrical transmission lines, and charging leads. The termination bumps are formed as integral parts of the charge leads and are connected directly to the charge driver board electronics by pressure contact. The bumps can be formed by mechanically indenting the termination pads or by using an interposer that has raised metallic pads aligned to the integral nickel pads and the charge driver circuitry board. First, a mask is aligned to permit additive formation of the pads, conductors, and charge leads. Then the nickel circuitry thus formed is made into a rigid charge plate and an integrated flexible section having contact bumps. After bonding the rigid and flexible substrates to the electroformed circuitry the copper substrate is completely removed by selective etching, thus exposing the mechanically deformed bumps on the lead terminations, one for each charge lead. The bump thus formed is used to provide a high pressure point electrical connection to the charge plate.

14 Claims, 1 Drawing Sheet

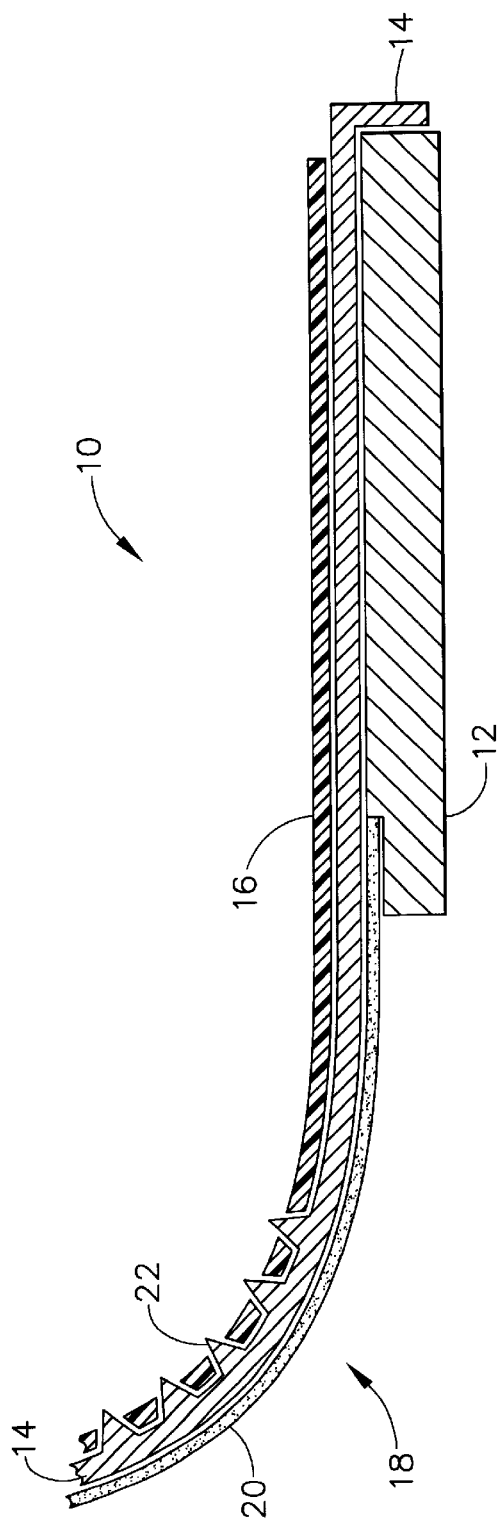
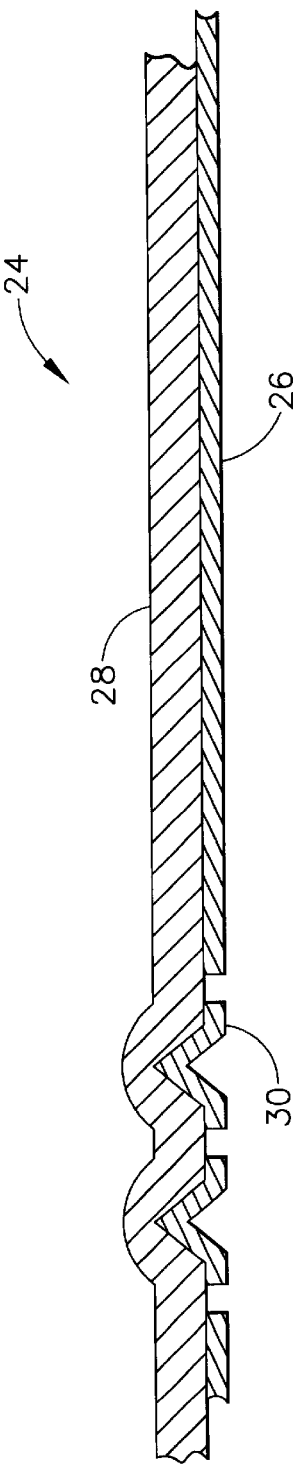
FIG. 1
FIG. 2

INK JET CHARGE PLATE WITH INTEGRATED FLEXIBLE LEAD CONNECTOR STRUCTURE

TECHNICAL FIELD

The present invention relates to continuous ink jet printers and more particularly to interconnection technology for ink jet charge plates for such printers.

BACKGROUND ART

In continuous ink jet printing, ink is supplied under pressure to a manifold that distributes the ink to a plurality of orifices, typically arranged in linear array(s). The ink is expelled from the orifices in jets which break up due to surface tension in the ink into droplet streams. Ink jet printing is accomplished with these droplet streams by selectively charging and deflecting some droplets from their normal trajectories. The deflected or undeflected droplets are caught and re-circulated and the others are allowed to impinge on a printing surface.

Planar charge plate structures have been utilized for many years for continuous ink jet printheads. In existing ink jet printing systems, the planar charging assembly consists of three units. These three units include flat charge plate leads bonded to a flat rigid ceramic material; charge drivers and circuitry on a rigid printed circuit board; and a flexible circuit to connect the charge leads of the charge plate to the driver circuit board. Electroformed charge plate coupons are disclosed in U.S. Pat. Nos. 4,560,991, and 5,512,117, fully incorporated by reference herein. Charge plate coupons consisting of nickel leads pattern plated onto a sacrificial, selectively etchable substrate are attached nickel-lead-down to a dielectric substrate. The sacrificial copper is then etched away, leaving the discrete nickel leads bonded to the flat, rigid substrate. The leads on the charge plate must then have a mating flex circuit to bridge to a separate charge driver electronics board.

It would be desirable to have an improvement of the flat face charging concept, wherein the flex cable is made as an integral part of the charge plate coupon, thus eliminating a separate flex cable and the required assembly thereof.

SUMMARY OF THE INVENTION

It is the object of the present invention to provide an improvement of the flat face charging concept, wherein the flex cable is made as an integral part of the charge plate coupon. This arrangement eliminates the need for a separate flex cable and the required assembly thereof.

In accordance with one aspect of the present invention, a method is provided for making a charging electrode structure for flexible electrical connection between charging electrodes and control electronics. Initially, an electrode structure is electroformed onto a sacrificial metallic substrate. A first portion of the electrode structure forms the charging electrodes, and a second portion of the electrode structure forms the flexible electrical connection. The second portion of the electrode structure is then laminated to a flexible carrier film, while the first portion of the electrode structure is laminated to a rigid, dielectric substrate. Then the sacrificial metallic substrate is removed.

Other objects and advantages of the invention will be apparent from the following description and the appended claims.

BRIEF DESCRIPTION OF THE DRAWING

FIG. 1 illustrates a cross section of an integrated charge plate assembly with the flexible cable interconnect as part of the charge plate, in accordance with the present invention; and FIG. 2 illustrates precursor electroformed leads on a sacrificial charge plate substrate.

DETAILED DESCRIPTION OF THE INVENTION

The present invention proposes a technique for forming an integrated flex/charge plate assembly. Shown in FIG. 1 is a cross section of an integrated charge plate assembly 10 with the flexible cable interconnect laminated to a polyimide flex carrier film as part of the charge plate. The assembly 10 shown in FIG. 1 has the traditional rigid charge plate substrate 12, nickel electrical leads 14 and protective dielectric coating 16. The novel integrated flexible portion 18 comprises the nickel leads 14 extended and laminated to a polyimide carrier film 20. Although the structure of FIG. 1 shows the raised bump termination 22 on the integral termination pads, flat pads with interposers could be used as well to make the connection to the charge driver board.

Referring now to FIG. 2, there is illustrated an assembly 24 with precursor electroformed nickel leads 26 on the sacrificial charge plate substrate 28. The sacrificial charge plate substrate may be of any suitable material, such as copper or beryllium copper. The termination pads 30 are formed by indenting the nickel termination pads that are electroformed as part of the nickel charge leads and are mechanically indented prior to lamination if raised terminations are required.

In a preferred embodiment of the present invention, the lamination sequence is to first hot press a commercially available polyimide 20 having a thermoplastic adhesive onto the flex portion of the coupon 24. The polyimide flex carrier film is attached to the side of the coupon having the electroformed electrode structure 26. Next, the portion of the coupon 24 which is to form the charge plate is epoxy bonded to the charge plate substrate 12 (e.g., aluminum oxide), by suitable means such as those described in U.S. Pat. No. 5,512,117, totally incorporated herein by reference. As in the U.S. Pat. No. 5,512,117 patent, the electroformed side of the coupon is bonded to the substrate. The sacrificial substrate 28 (e.g., beryllium copper or other suitable material) is then etched away and the dielectric protective coating 16 is applied to the assembly. Prepunched or photoimaged openings are provided to expose just the contact terminations.

The integrated flexcharge plate assembly of the present invention has the advantage of being is more economical to assemble than prior art configurations. The structure of the present invention is also more reliable because one component (i.e., the discrete flex cable) and one half of the interconnection points are eliminated.

The actual design and implementation of the concept requires that the conventional charge leads be extended in length a distance equivalent to the length of the conventional flexible interconnect normally used in the assembly of the laminated charge plate to the charge driver board. This is accomplished by photoimaging the desired pattern onto the sacrificial copper substrate. The pattern has at one end the charge leads for bending at a right angle to effect charging of ink droplets, and at the other end termination pads for connecting directly to the charge driver board. The copper substrate is pattern plated with nickel in the usual manner and then the pads terminating the nickel leads can be mechanically punched with a pointed punch to form a raised conical structure suitable for making direct pressure contact to the mating metallic pads of the charge driver board. In the old process, these raised terminations were made at both ends of a flexible cable and then pressure contact was made on the charge plate side and the charge driver board side, requiring twice as many connections as the new integrated assembly.

After the sacrificial copper substrate is plated with the integrated electrode structure, the portion of the length that forms the charge leads is bonded to the charge plate substrate 12 and the portion that forms the flexible cable end is bonded to the polyimide flex carrier film 18. The sacrificial copper substrate is then dissolved in a selective etchant that does not attack the nickel leads, but does remove the copper substrate leaving electrically isolated nickel leads. Finally, a dielectric protective coating 16 is applied to insulate the charge leads that lead to the terminations 22. The termination bumps are an integral part of the nickel leads and are exposed through the dielectric coating so that they can make electrical contact to the metallic pads of the charge driver circuit board.

The invention has been described in detail with particular reference to certain preferred embodiments thereof, but it will be understood that modifications and variations can be effected within the spirit and scope of the invention.

What is claimed is:

1. A method for making a charging electrode structure for flexible electrical connection between charging electrodes and control electronics comprising the steps of:

electroforming an electrode structure onto a sacrificial metallic substrate;

forming the charging electrodes and the flexible electrical connection on the electrode structure, to form a charging electrodes portion of the electrode structure and a flexible electrical connection portion of the electrode structure;

laminating the flexible electrical connection portion of the electrode structure to a flexible carrier film;

laminating the charging electrodes portion of the electrode structure to a rigid, dielectric substrate; and dissolving the sacrificial metallic substrate in a selective etchant.

2. A method for making a charging electrode structure as claimed in claim 1 wherein the sacrificial metal substrate comprises a copper alloy.

3. A method for making a charging electrode structure as claimed in claim 2 wherein the copper alloy comprises beryllium copper.

4. A method for making a charging electrode structure as claimed in claim 1 wherein the rigid dielectric substrate comprises a ceramic.

5. A method for making a charging electrode structure as claimed in claim 1 wherein the flexible carrier film comprises a polyimide material.

6. A method for making a charging electrode structure as claimed in claim 1 further comprising the step of laminating a protective dielectric layer to the electroformed electrode structure on a side of the electroformed electrode structure from which the sacrificial metallic substrate was dissolved.

7. A method for making a charging electrode structure as claimed in claim 1 wherein the step of laminating the electroformed electrode structure to the rigid dielectric substrate comprises laminating the electrode structure to more than one face of the dielectric substrate.

8. A charging electrode structure for flexible electrical connection between charging electrodes and control electronics comprising:

an electrode structure electroformed onto a sacrificial metallic substrate, the electrode structure having a charging electrodes portion on which the charging electrodes are formed and a flexible electrical connection portion on which the flexible electrical connection is formed;

a flexible carrier film on which the flexible electrical connection portion of the electrode structure is laminated;

a rigid, dielectric substrate on which the charging electrodes portion of the electrode structure is laminated; and a selective etchant for dissolving the sacrificial metallic substrate.

9. A charging electrode structure as claimed in claim 8 wherein the sacrificial metal substrate comprises a copper alloy.

10. A charging electrode structure as claimed in claim 9 wherein the copper alloy comprises beryllium copper.

11. A charging electrode structure as claimed in claim 8 wherein the rigid dielectric substrate comprises a ceramic.

12. A charging electrode structure as claimed in claim 8 wherein the flexible carrier film comprises a polyimide material.

13. A charging electrode structure as claimed in claim 8 further comprising a protective dielectric layer laminated to the electroformed electrode structure on a side of the electroformed electrode structure from which the sacrificial metallic substrate was dissolved.

14. A charging electrode structure as claimed in claim 8 wherein the electrode structure is laminated to more than one face of the dielectric substrate.

* * * * *